United States Patent
Chang et al.

(10) Patent No.: US 7,672,658 B2
(45) Date of Patent: Mar. 2, 2010

(54) FREQUENCY-CONVERTING CIRCUIT AND DOWN CONVERTER WITH THE SAME

(75) Inventors: Jen-Chung Chang, Jhongli (TW); Chia-Jung Hsu, Hsinchu (TW); Shey-Shi Lu, Taipei (TW); Hsiao-Chin Chen, Hsinchu (TW); Yu-Yee Liow, Jhubei (TW)

(73) Assignees: United Microelectronics Corp., Hsinchu (TW); National Taiwan University, Taipei (TW)

( * ) Notice: Subject to any disclaimer, the term of this patent is extended or adjusted under 35 U.S.C. 154(b) by 767 days.

(21) Appl. No.: 11/484,267

(22) Filed: Jul. 10, 2006

(65) Prior Publication Data

US 2008/0009259 A1    Jan. 10, 2008

(51) Int. Cl.
  *H04B 1/26* (2006.01)
  *H02J 1/02* (2006.01)

(52) U.S. Cl. .................. 455/318; 455/333; 455/323; 363/39

(58) Field of Classification Search ............... 363/39; 336/180, 183; 455/318, 323, 333
  See application file for complete search history.

(56) References Cited

U.S. PATENT DOCUMENTS

| | | | |
|---|---|---|---|
| 4,429,418 A | 1/1984 | Hooper | 455/314 |
| 5,477,204 A * | 12/1995 | Li | 336/200 |
| 6,675,003 B1 | 1/2004 | Dubash et al. | 455/302 |
| 6,725,029 B1 | 4/2004 | Allen | 455/302 |
| 6,738,611 B1 | 5/2004 | Politi | 455/302 |
| 6,810,242 B2 | 10/2004 | Molnar et al. | 455/326 |
| 6,861,891 B2 | 3/2005 | Romano | 327/355 |
| 6,919,851 B2 | 7/2005 | Rogers et al. | 343/749 |
| 2002/0123319 A1* | 9/2002 | Peterzell | 455/296 |
| 2003/0094976 A1* | 5/2003 | Miyashita | 327/40 |
| 2004/0097211 A1 | 5/2004 | Dubash et al. | 455/285 |
| 2004/0106391 A1 | 6/2004 | Romano | 455/323 |
| 2006/0003717 A1 | 1/2006 | Sowlati | 455/168.1 |

OTHER PUBLICATIONS

Rahul Magoon et al., "A single-Chip Quad-Band (850/900/1800/1900 MHz) Direct Conversion GSM/GPRS RF Transceiver with Integrated VCOs and Fractional-$N$ Synthesizer" IEEE Journal of Solid-State Circuits, vol. 37, No. 12, Dec. 2002, pp. 1710-1720.

(Continued)

*Primary Examiner*—Lana N Le
*Assistant Examiner*—Hsin-Chun Liao
(74) *Attorney, Agent, or Firm*—J.C. Patents (57) ABSTRACT

A frequency-converting circuit and a down converter with the frequency-converting circuit are disclosed. The above-mentioned frequency-converting circuit is used for converting an RF signal into a first baseband signal according to a polyphase LO signal. The frequency-converting circuit includes a coupler, a first transduction unit and a first switching unit. The coupler is for receiving and splitting the RF signal and delivering a first RF signal via the first output terminal thereof. The first transduction unit is for amplifying the first RF signal. The first switching unit is for performing switching operations on the output signal of the first transduction unit and producing the first baseband signal.

17 Claims, 9 Drawing Sheets

OTHER PUBLICATIONS

John R. Long, "A Low-Voltage 5.1-5.8-GHz Image-Reject Downconverter RF IC" IEEE Journal of Solid-State Circuits, vol. 35, No. 9, Sep. 2000, pp. 1320-1328.

Kwang-Jin Koh et al., "Subharmonically Pumped CMOS Frequency Conversion (Up and Down) Circuits for 2-GHz WCDMA Direct-Conversion Transceiver" IEEE Journal of Solid-State Circuits, vol. 39, No. 6, Jun. 2004-, pp. 871-884.

Marc Goldfarb et al., "Even Harmonic Double-Balanced Active Mixer for Use in Direct Conversion Receivers" IEEE Journal of Solid-State Circuits, vol. 38, No. 10, Oct. 2003, pp. 1762-1766.

Liwei Sheng et al., "A Wide-Bandwidth Si/SiGe HBT Direct Conversion Sub-Harmonic Mixer/Downconverter" IEEE Journal of Solid-State Circuits, vol. 35, No. 9, Sep. 2000, pp. 1329-1337.

Richard Svitek et al., "5-6 GHz SiGe Active I/Q Subharmonic Mixers With Power Supply Noise Effect Characterization" IEEE Microwave and Wireless Components Letters, vol. 14, No. 7, Jul. 2004, pp. 319-321.

* cited by examiner

|  | PRESENT EMBODIMENT | PRIOR ART 1 | PRIOR ART 2 | PRIOR ART 3 | PRIOR ART 4 |
|---|---|---|---|---|---|
| PROCESS TECHNOLOGIES | CMOS | SiGe | SiGe | SiGe | CMOS |
| POWER (mV) | 3.5 | 16.5 | 9.2 | 12.6 | 12.1 |
| FREQUENCY OF RF SIGNAL (GHz) | 5.9 | 5.2 | 2.0 | 2.1 | 2.0 |
| GAIN (dB) | 10.8 | 6 | 17.2 | 18.1 | 20 |
| NOISE FIGURE (dB) | 25.5 | N.A. | 9.8 | 8 | 8.5 |
| IIP3 (dBm) | 7.9 | 4.6 | -5.1 | -6.5 | 4* |
| IIP2 (dBm) | 54.0 | 29.0 | 31.7 | 30 | 41 |
| FOM (dBm) | 267.2 | N.A. | 240.9 | 239.8 | 262.4 |
| LOR (dB) | 29.8 | N.A. | 35 | N.A. | N.A. |
| LO LEAKAGE (dBm) | -51.1 | -55 | N.A. | N.A. | -57.0 |
| LO2 LEAKAGE (dBm) | -84.1 | -60 | -61.8 | -44 | N.A. |

FREQUENCY-CONVERTING CIRCUIT AND DOWN CONVERTER WITH THE SAME

BACKGROUND OF THE INVENTION

1. Field of Invention

The present invention relates to a frequency-converting circuit, and more particularly, to a frequency-converting circuit using a transformer-coupling approach.

2. Description of the Related Art

In recent years, a so-called direct-conversion receiver (termed as homodyne receiver or zero-IF receiver, too) has become more important by its high performances, such as architecture simplicity and monolithic design, in the field of transceivers. However, some drawbacks of the conventional direct-conversion receiver resulted from the adopted scheme of one-off zero-IF operation are to be overcome. For example, the frequency of the poly-phase local oscillating signal (poly-phase LO signal) generated by such sort of receiver is very close to the one of the radio frequency signal (RF signal). In addition, the isolation between both of the mixer in the receiver and the input terminal jointly referred to "RF signal input terminal" herein) of the low noise amplifier (LNA) and the poly-phase LO signal received by the mixer is not infinite. Therefore, a poly-phase LO signal present at the RF signal input terminal through a feedthrough effect would be self-mixed with the original poly-phase LO signal, which further causes a DC offset to affect the originally received RF signal.

Figure 1:
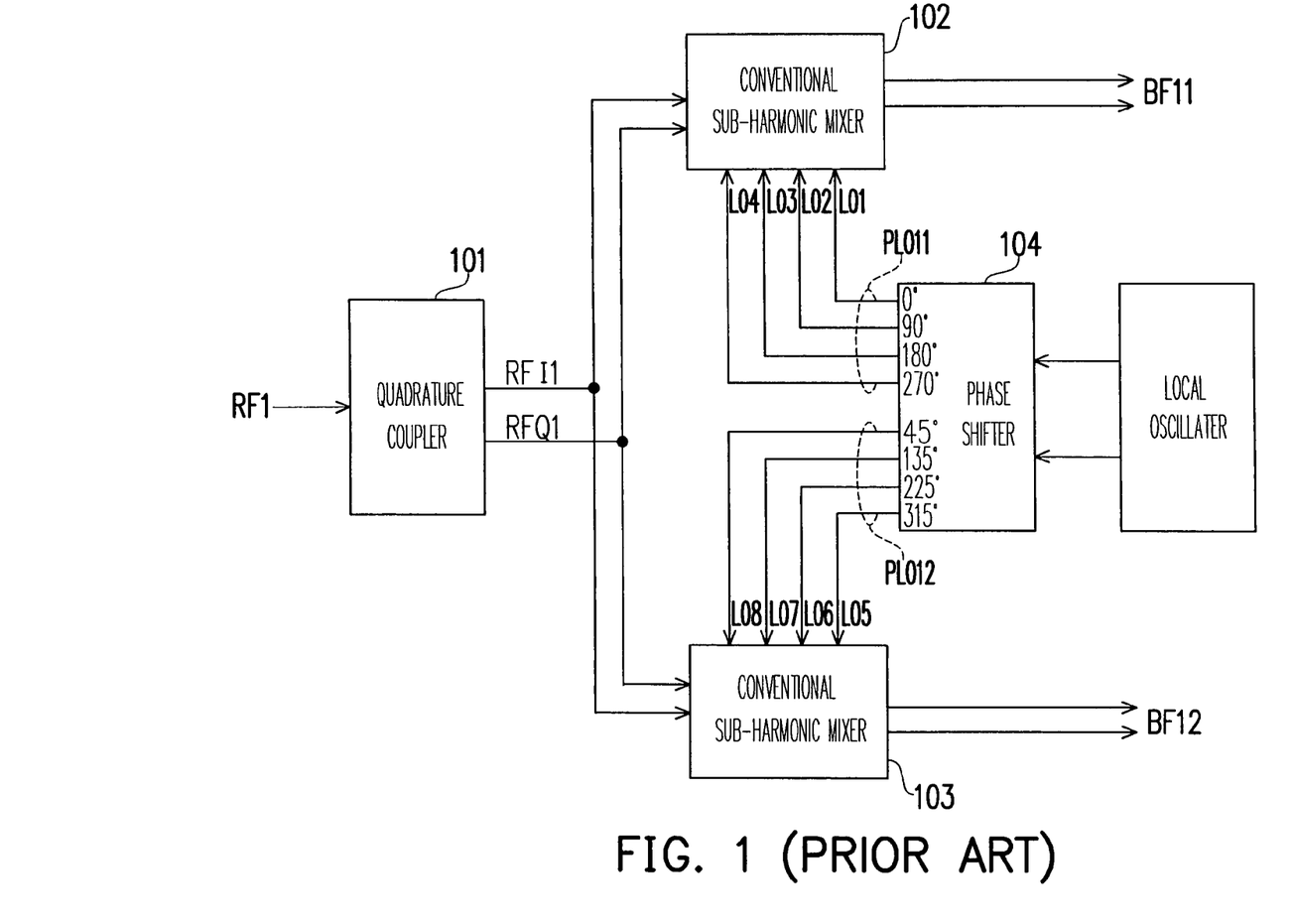
FIG. 1 is a structure diagram of a conventional down converter.

For solving the above-mentioned problem, the conventional down converter employs a conventional sub-harmonic mixer (SHM) with high isolation characteristic to decrease the DC offset, as shown in FIG. 1. Wherein, conventional SHMs 102 and 103 are circuits with double input ports and double output ports so that the received differential input signals, i.e. the RF signals RFI1 and RFQ1, are the ones generated by a quadrature coupler 101 receiving the RF signal RF1. At the point, for the down converter to obtain two baseband signals BF11 and BF12 which are quadrature to each other, a phase shifter 104 must provide two sets of poly-phase LO signals PLO 11 and PLO12. The poly-phase LO signal PLO11 herein includes local oscillating signals (LO signals) LO1~LO4, which have phase displacements of 0°, 90°, 180° and 270°, respectively. The poly-phase LO signal PLO12 includes LO signals LO5~LO8, which have phase displacements of 45°, 135°, 225° and 315°, respectively. To generate eight LO signals LO1~LO8 with different phase displacements, the conventional down converter is required to employ the phase shifter 104 with a remarkably complex structure. In other words, a conventional down converter with reduced DC offset by using conventional SHMs results in a dilemma where the advanced electric behavior of the circuit is associated with increased circuit complexity and chip area consumption.

SUMMARY OF THE INVENTION

An objective of the present invention is to provide a frequency-converting circuit, in which a transformer-coupling approach is used. While a first transduction unit and a second transduction unit run in single input port mode, two quadrature RF signals are associatively generated by a coupler. Therefore, compared with the conventional architecture, the present invention can save power consumption since not only a set of poly-phase LO signals is to be received, but also the coupler adopts single input port scheme.

Another objective of the present invention is to provide a down converter. By using the transformer-coupling approach for the frequency-converting circuit to generate a set of poly-phase LO signals, reducing the circuit complexity and saving the chip area can be achieved.

To achieve the above-described or other objectives, the present invention provides a frequency-converting circuit for converting an RF signal into a baseband signal according to a poly-phase LO signal, wherein the baseband signal includes a first baseband signal. The frequency-converting circuit includes a coupler, a first transduction unit and a first switching unit. The coupler is used for receiving and then splitting an RF signal and delivering a first RF signal via a first output terminal. The first transduction unit electrically connected to the first output terminal is used for amplifying the first RF signal. After that, the first switching unit switches the output signals from the first transduction unit according to the poly-phase LO signal to produce and output the first baseband signal.

In an embodiment, the above-mentioned baseband signal further includes a second baseband signal and the frequency-converting circuit accordingly further includes a second transduction unit and a second switching unit. The second transduction unit is electrically connected to the second output terminal of the coupler for amplifying the second RF signal come from the second output terminal. After that, the second switching unit electrically connected to the second transduction unit switches the output signals from the second transduction unit according to the poly-phase LO signal to produce and output the second baseband signal.

Furthermore, the present invention provides a down converter for converting an RF signal into a baseband signal, which includes a first baseband signal. The down converter includes a signal generator circuit and a frequency-converting circuit. The frequency-converting circuit includes a coupler, a first transduction unit and a first switching unit. The signal generator circuit is for providing a poly-phase LO signal. The frequency-converting circuit uses the coupler for receiving and then splitting an RF signal, so that the first transduction unit electrically connected to the first output terminal of the coupler is able to amplify the first RF signal. After that, the first switching unit switches the output signals from the first transduction unit according to the poly-phase LO signal to produce and output the first baseband signal.

According to an embodiment of the present invention, the above-described signal generator circuit includes a local oscillator (LO) and a phase shifter. The LO is used for generating an LO signal, while the phase shifter coupled with the LO is used for converting the LO signal into LO signals with multiple different phase displacements so as to output them as the poly-phase LO signal.

The present invention uses a transformer-coupling approach to enable the first transduction unit and the second transduction unit to run in single input port mode for respectively receiving the first RF signal and the second RF signal produced by the coupler, so that the first and second transduction units are able to use a set of poly-phase LO signals to produce the first and second baseband signals quadrature to each other. In this way, in comparison with the conventional architecture, the coupler in single input port mode has advantages not only of saving power consumption, but also of reducing the circuit complexity and chip area by means of the down converter of the frequency-converting circuit.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

Figure 2:
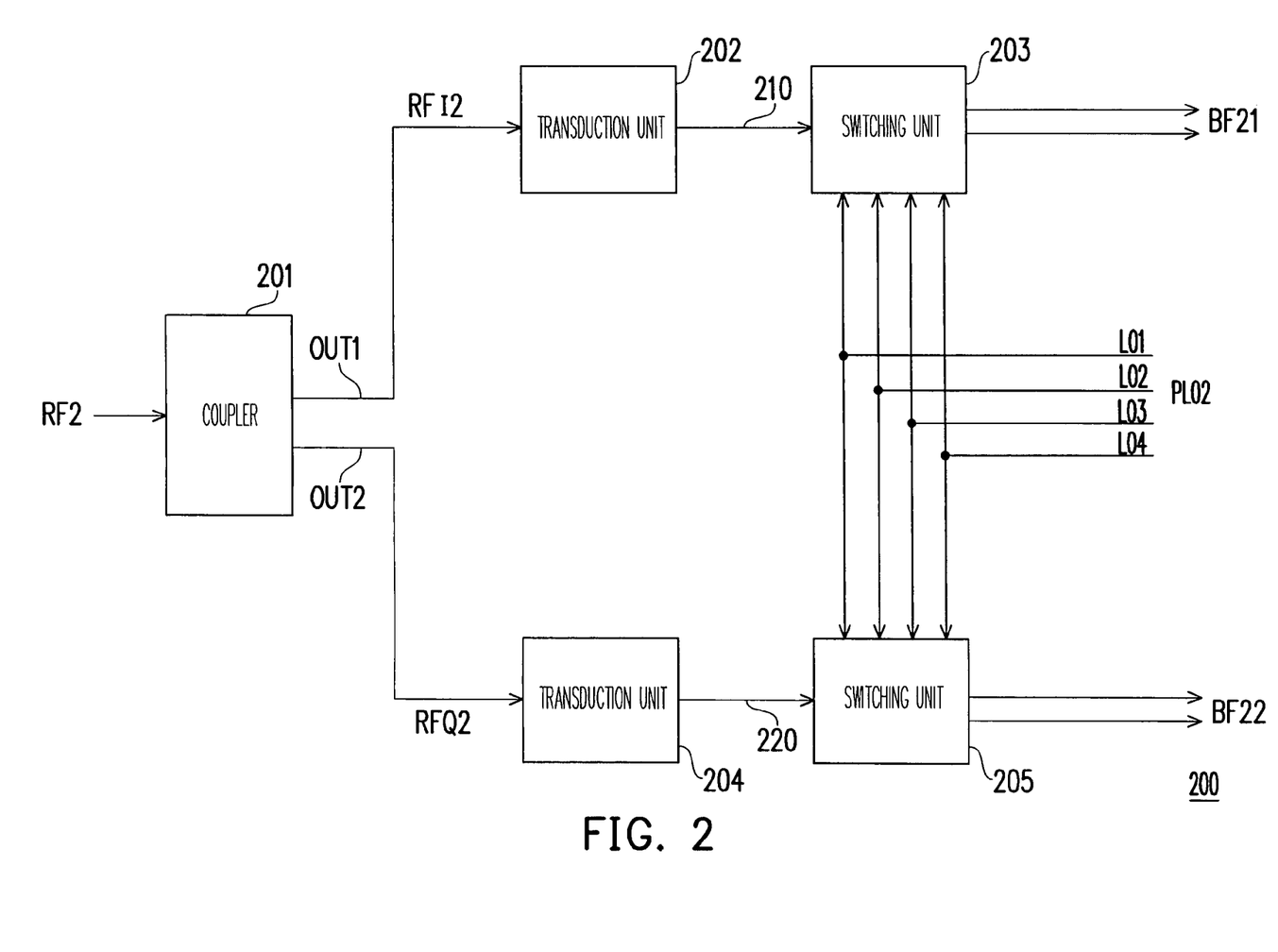
FIG. 2 is a structure diagram of a frequency-converting circuit according to an embodiment of the present invention.

FIG. 2 is a structure diagram of a frequency-converting circuit according to an embodiment of the present invention. The frequency-converting circuit includes a coupler 201, two transduction units 202 and 204 and two switching units 203 and 205. The transduction unit 202 is electrically connected to a first output terminal OUT1 of the coupler 201. The switching unit 203 is electrically connected to the transduction unit 202. The frequency-converting circuit 200 converts an RF signal RF2 into a baseband signal according to a poly-phase LO signal PLO2, wherein the baseband signal includes a first baseband signal BF21. In short, the operation of the frequency-converting circuit 200 includes: the coupler 201 receives and splits the RF signal RF2; the transduction unit 202 after the coupler amplifies a first RF signal RFI2 sent from the first output terminal OUT1; the switching unit 203 switches the output signal of the transduction unit 202 and produces the first baseband signal BF21 according to the poly-phase LO signal PLO2.

The above-mentioned baseband signal further includes a second baseband signal BF22, which is quadrature to the first baseband signal BF21, i.e. 90 degrees apart in phase to each other. The transduction unit 204 is electrically connected to a second output terminal OUT2 of the coupler 201. The switching unit 205 is electrically connected to the transduction unit 204. The transduction unit 204 is used for amplifying a second RF signal RFQ2 sent from the second output terminal OUT2. The switching unit 205 switches the output signal of the transduction unit 204 and produces the second baseband signal BF22 according to the poly-phase LO signal PLO2, wherein the second baseband signal BF22 and the first baseband signal BF21 are quadrature to each other.

The above-described poly-phase LO signal includes LO signals LO1~LO4, wherein the frequencies of the LO signals LO 1~LO4 are 0.5 times of the frequency of the RF signal RF2. In an embodiment, the phase displacements of the LO signals LO1~LO4 are 0°, 90°, 180° and 270°, respectively or 45°, 135°, 225° and 315°, respectively, and so on. For anyone skilled in the art, it is obvious that as long as the phase displacement of the i-th LO(i) is 90° is smaller than the phase displacement of the (i+1)-th LO(i+1) by design, the allocation of phase displacements of the LO signals LO1~LO4 is acceptable by the present invention, wherein i is a positive integer larger than zero and $1 \leq i \leq 3$.

Figure 3:
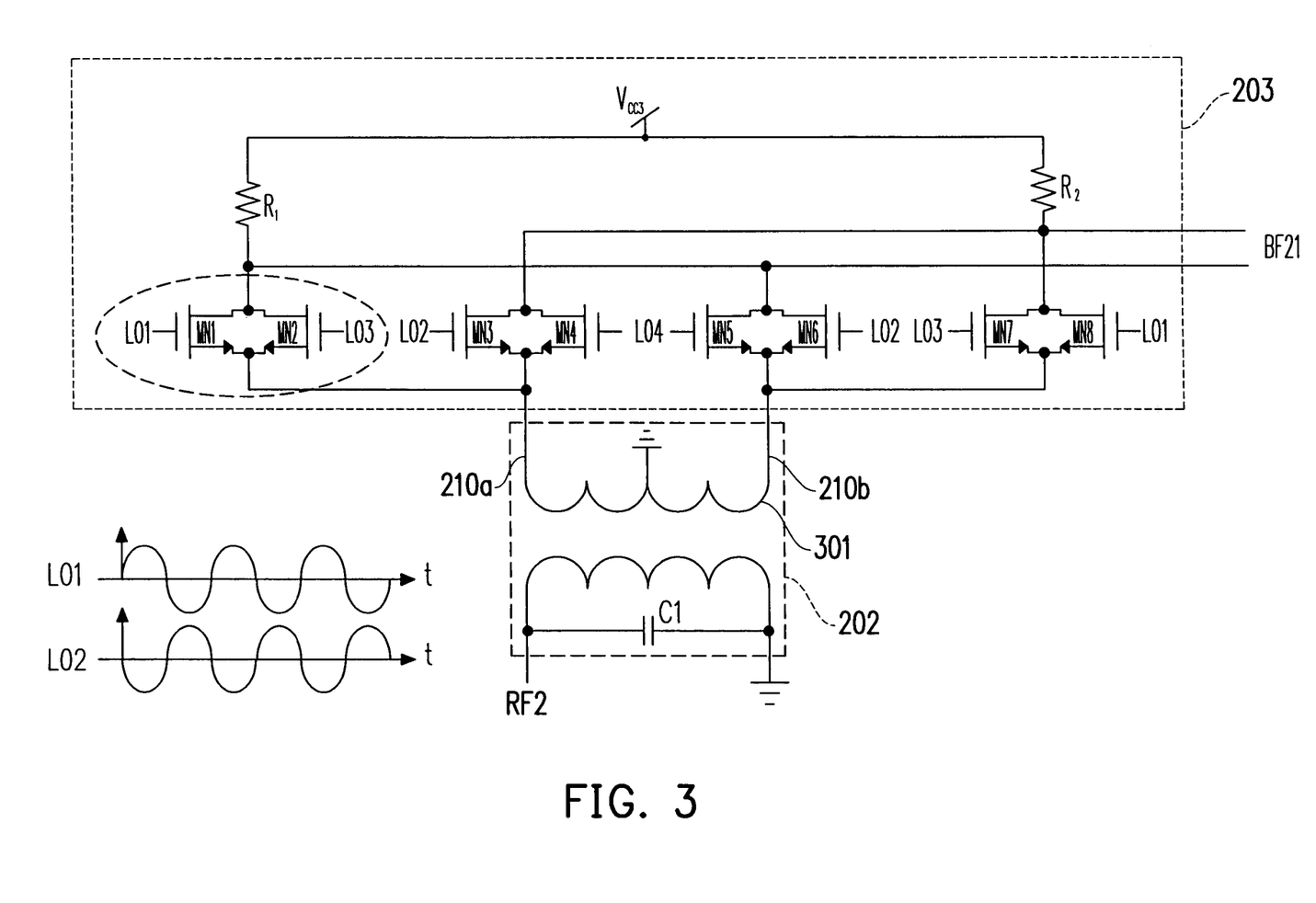
FIG. 3 is a detailed circuit drawing of a transduction unit and a switching unit according to an embodiment of the present invention.

FIG. 3 is a detailed circuit drawing of a transduction unit 202 and a switching unit 203 according to an embodiment of the present invention. The input terminals 210a and 210b in FIG. 3 are corresponding to the differential input terminal 210 of the switching unit 203 in FIG. 2. Continuing to FIG. 3, the transduction unit 202 includes a capacitor C1 and a transformer 301. A switching unit 203 includes resistors $R_1$ and $R_2$ and N-type transistors MN1~MN8. The first ends of the resistors $R_1$ and $R_2$ are coupled with an operation voltage $V_{CC3}$. The drains of the N-type transistors MN1, MN2, MN5 and MN6 are coupled with the second end of the resistor $R_1$, while the drains of the N-type transistors MN3, MN4, MN7 and MN8 are coupled with the second end of the resistor $R_2$. The sources of the N-type transistors MN1~MN4 are coupled with the second end of the secondary winding of the transformer 301. The middle tapped end of the secondary winding of the transformer 301 is grounded, while the second end of the primary winding of the transformer 301 is grounded too.

Figure 4:
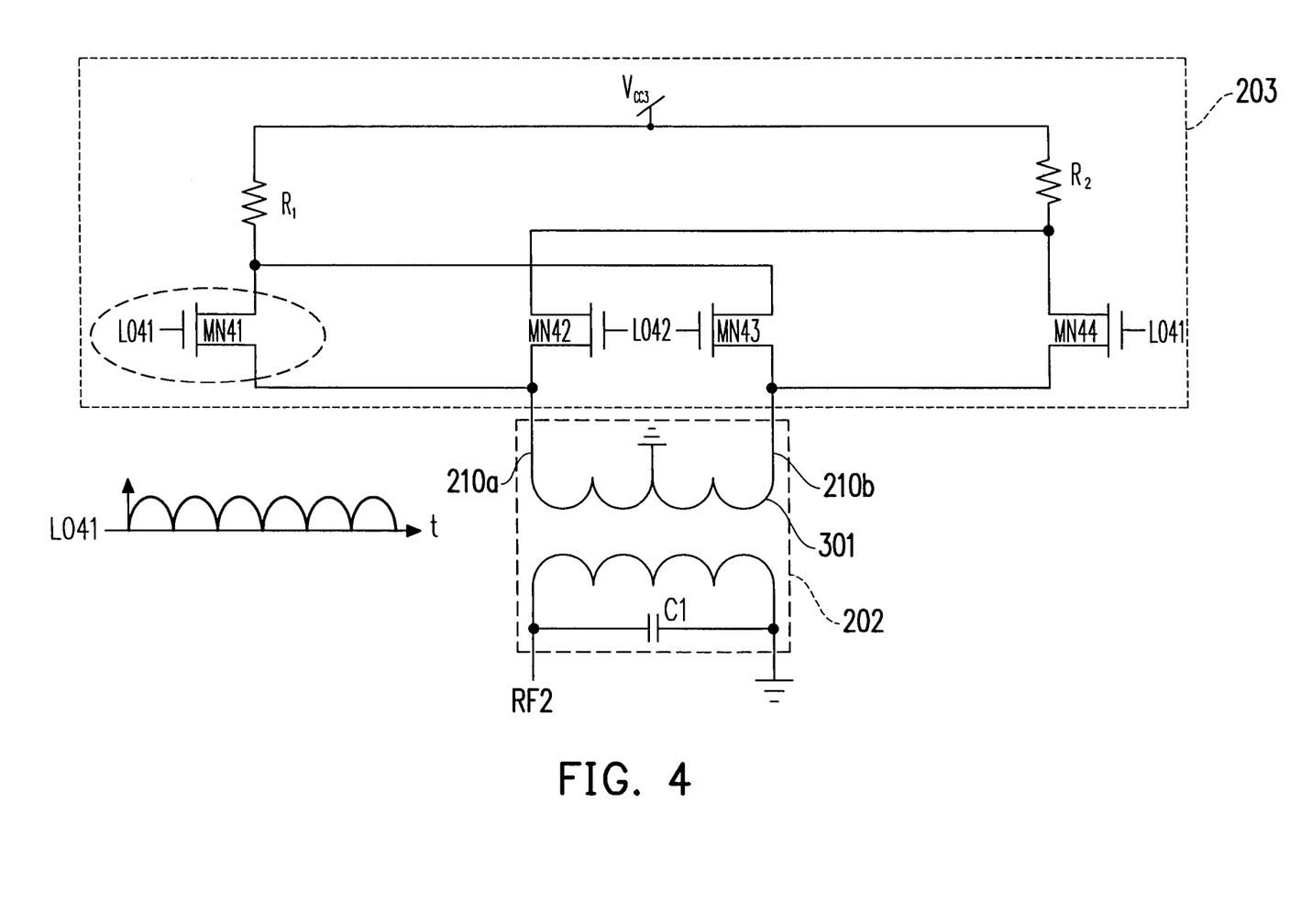
FIG. 4 is a drawing of a Gilbert circuit coupling a transformer according to the embodiment shown in FIG. 3.

Continuing to FIG. 3, the transformer 301 herein has the configuration with single input port and double output ports and provides the RF signal RF2 with a transduction gain to convert the RF signal RF2 into differential current signals, followed by sending the differential current signals to the source terminals of the N-type transistors MN1~MN8. By using the transformer 301 to couple with the RF signal RF2, the configuration of the present invention not only has the potential of high-linearity performance, but also reduces the usage of stacked transistors in comparison with the conventional transduction circuit formed by transistors. Furthermore, to run the circuit under low-voltage condition can be realized. FIG. 4 is a drawing of a Gilbert circuit coupling a transformer according to the embodiment shown in FIG. 3. Referring to FIG. 4, the operations of the N-type transistors MN1~MN8 are explained as follows. In FIG. 4, a transformer couples to every N-type transistor in the Gilbert circuit, wherein, for example, an N-type transistor MN41 is counted as a pair of N-type transistors MN1 and MN2 in parallel connection in FIG. 3. With such a layout, the frequency of the LO signals LO1~LO4 is changed to be 0.5 times of the frequency of the LO signals LO41 and LO42. Thus, the Gilbert circuit coupling the transformer in FIG. 4 functions like the one in FIG. 3. The N-type transistors MN1~MN8 in FIG. 4 function as switches and periodically perform current-switching operations on the differential current signals produced by the transformer 301 according to the LO signals LO1~LO4, followed by achieving a frequency-mixing effect and outputting the first baseband signal BF21. By means of the architecture combining the transduction unit 202 and the switching unit 203, the present invention not only keeps the frequency of the LO signals LO1~LO4 at 0.5 times of the frequency of the RF signal RF2, but also remains the inherent high-isolation of a Gilbert circuit coupling a transformer.

Figure 5:
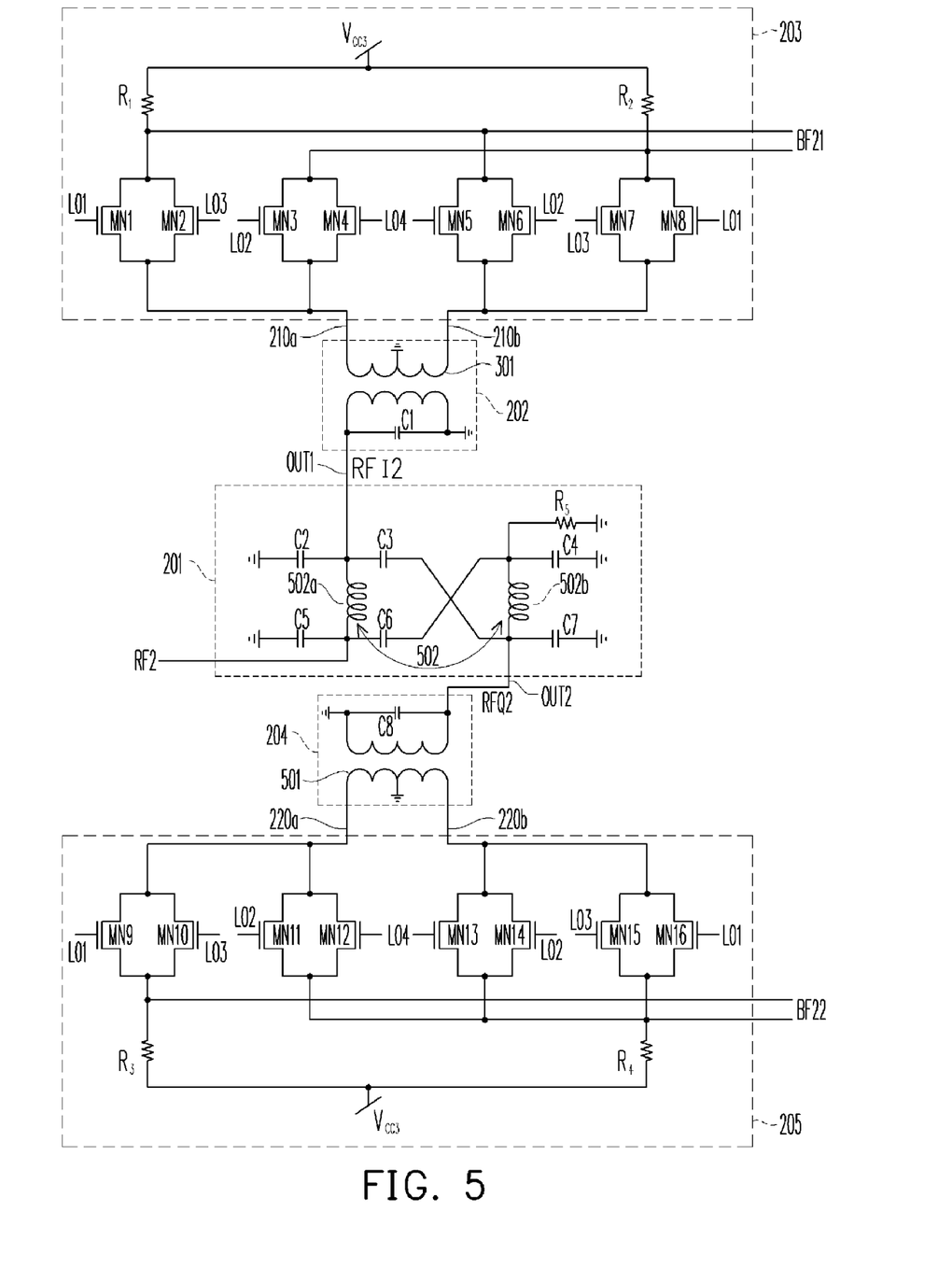
FIG. 5 is a detailed circuit drawing of a frequency-converting circuit according to an embodiment of the present invention.

FIG. 5 is a detail circuit drawing of a frequency-converting circuit according to an embodiment of the present invention. Referring to FIG. 5, the circuit structures and working principle of the transduction unit 202 and the switching unit 203 herein are the same as described in FIG. 3, while the transduction unit 204 includes a transformer 501 and a capacitor C8. The switching unit 205 includes resistors $R_3$ and $R_4$ and N-type transistors MN9~MN16. The circuit structures and working principle of the transduction unit 204 and the switching unit 205 herein are similar to the transduction unit 202 and the switching unit 203, and the details are omitted for simplicity. The coupler 201 in FIG. 5 is explained in detail as follows.

Continuing to FIG. 5, the coupler 201 includes capacitors C2~C7, a resistor $R_5$ and a transformer 502. The capacitors C2 is connected in series between the second end of the primary winding 502a of the transformer 502 and the grounding terminal. The capacitor C3 is connected in series between the second end of the primary winding 502a of the transformer 502 and the first end of the secondary winding 502b of the transformer 502. The capacitor C4 and the resistor $R_5$ are connected in series between the second end of the secondary winding 502b of the transformer 502 and the grounding terminal. The capacitor C6 is connected in series between the first end of the primary winding 502a of the transformer 502 and the second end of the secondary winding 502b of the transformer 502. The capacitors C7 is connected in series between the first end of the secondary winding 502b of the transformer 502 and the grounding terminal.

By using the structure formed by the transformer 502 and the capacitors C2~C7, the coupler 201 splits the RF signal RF2 into two quadrature RF signals RFI2 and RFQ2. The resistor $R_5$ is used for matching the circuit. Afterwards, the quadrature RF signals RFI2 and RFQ2 are respectively sent to the transduction units 202 and 204. At the point, the switching units 203 and 205 according to the received PLO2 (including the LO signals LO1~LO4) uses the N-type transistors MN1~MN8 and the N-type transistors MN9~MN16 to periodically perform current-switching operations on the differential current signals produced by the transduction units 202 and 204, respectively, followed by producing first baseband signals BF21 and BF 22, respectively.

Figure 6:
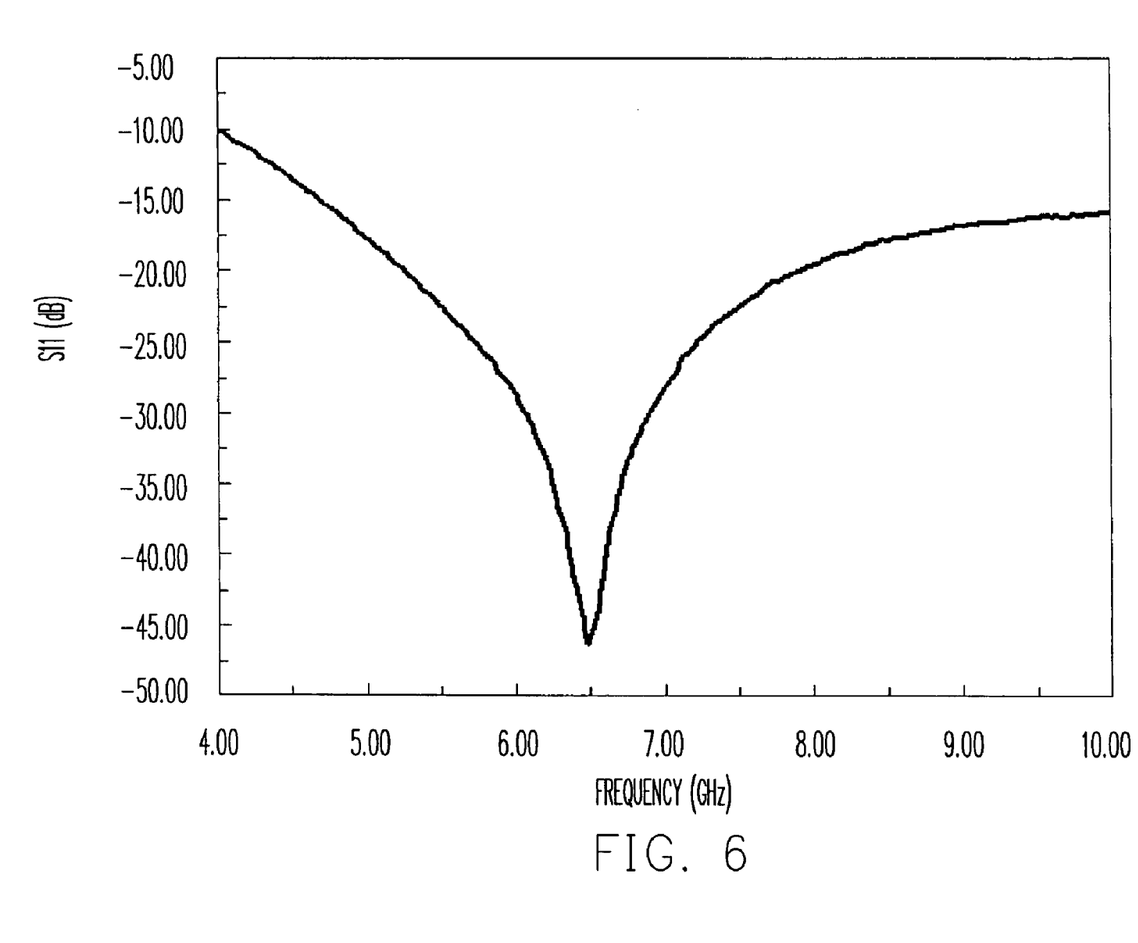
FIG. 6 and FIG. 7 illustrate some measurement results of the circuit characteristics given by the embodiment in FIG. 5.
Figure 7:
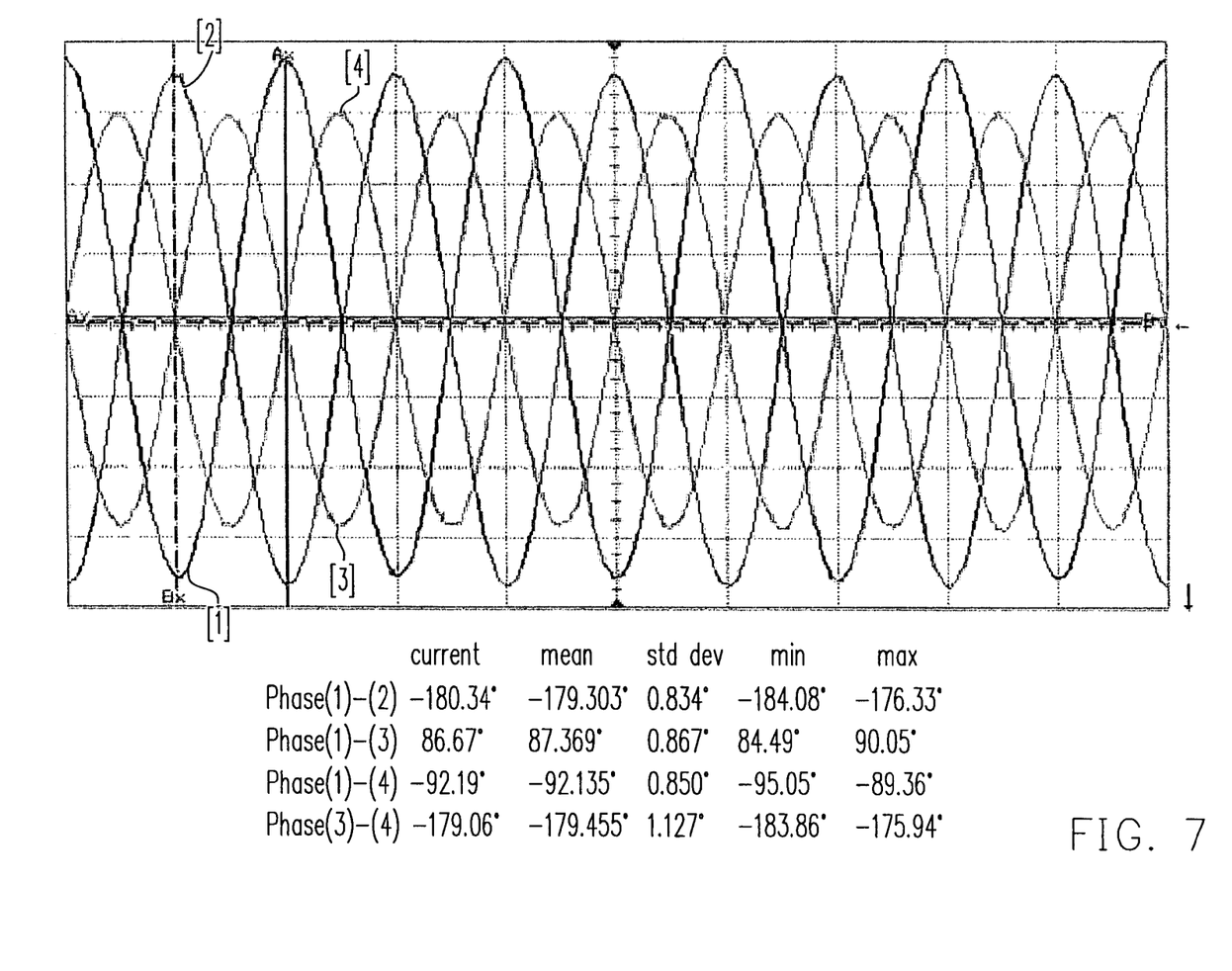
Figure 8:
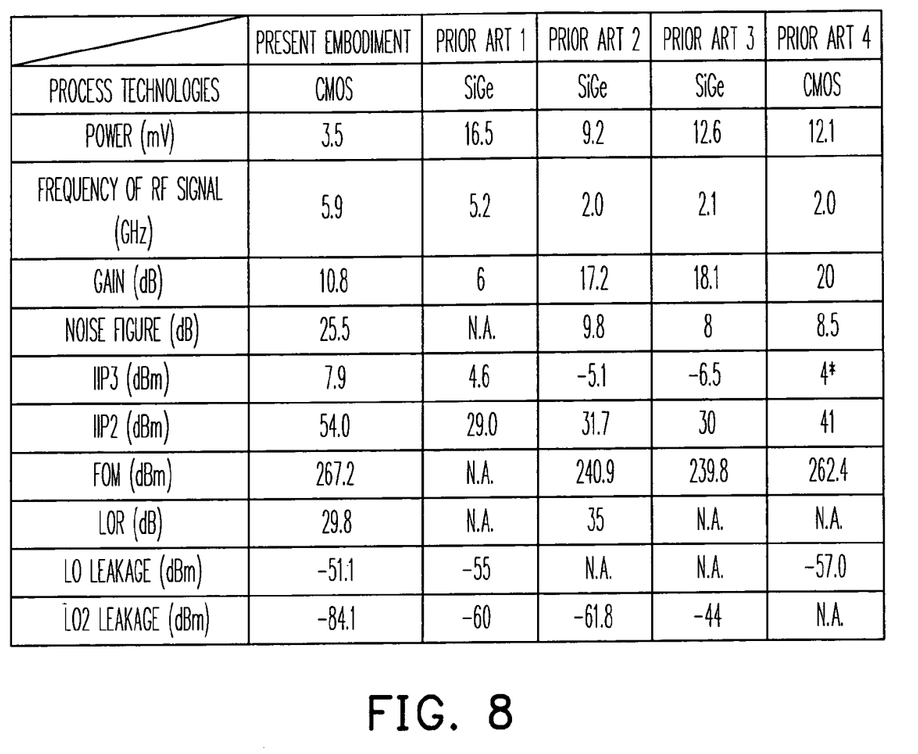
FIG. 8 is a table of the circuit characteristics for comparing the embodiment in FIG. 5 with the ones quoted from several published papers.

To further understand the present invention, some measurement results for the embodiment in FIG. 5 implemented with the currently standard 0.18 m CMOS process technology are given in FIGS. 6~8. Wherein, the operation voltage $V_{CC3}$ and the consumption current for the transduction unit 202 and the switching unit 203 in the embodiment of FIG. 5 are 1.8V and 1.96 mA, respectively. It can be seen from FIG. 6 that S11 among the scattering-parameters of the frequency-converting circuit 200 over the frequency range 4~10 GHz remains below −10 dB, which indicates the architecture by using the coupler 201 in association with a transformer coupling the RF signal RF2 demonstrates perfect input match behavior. The measurement results on the output signal of the frequency-converting circuit 200, i.e. the first baseband signal BF21 and the second baseband signal BF22, are given in FIG. 7. Referring to FIG. 7, a signal [1] and a signal [2] form the first baseband signal BF21, while a signal [3] and a signal [4] form the second baseband signal BF22. The phase difference between the two differential signals (signals [1] and [2]) of the first baseband signal BF21 is −180.34° measured, while the phase difference between the two differential signals (signals [3] and [4]) of the second baseband signal BF22 is −179.06° measured. In addition, the phase difference between the signals [1] and [3] and the phase difference between the signals [1] and [4] indicate the first baseband signal BF21 and the second baseband signal BF22 are quadrature to each other with a phase difference error below 3°.

In the table of FIG. 8, some comparison results between the present embodiment and the prior art are listed, wherein the conventional results are quoted from four papers of IEEE (Institute of Electrical and Electronic Engineers): *Microwave and Wireless Components Letters*, VOL.14, 2004, No. 7, PP. 319-321 (corresponding to conventional [1] in FIG. 8); *Solid-state Circuits*, VOL.35, 2000, No. 9, PP. 1329-1337 (corresponding to conventional [2] in FIG. 8); *Solid-state Circuits*, VOL.38, 2003, No. 10, PP. 1762-1766 (corresponding to conventional [3] in FIG. 8); *Solid-state Circuits*, VOL.39, 2004, No. 6, PP. 871-884 (corresponding to conventional [4] in FIG. 8). By comparing the results of the frequency-converting circuit of the present invention with the data cited from the papers, it suggests the present invention is superior to the prior art in terms of power, gain, input 3rd order intercept point (IIP3), input 2nd order intercept point (IIP2), figure-of-merit (FOM), LOR (local oscillator rejection) and leakage signal produced by the poly-phase LO signal. Wherein, FOM is one of the criteria for evaluating a frequency converter and FOM can be expressed by the following general formula, FOM=20*log(f)+Gain−10*log(Noise Factor−1)+IIP3+IIP2−10*log(Power), where f represents frequency. The symbol * in FIG. 8 indicates the sub-harmonic mixer (SHM) provided by the paper employs a linearization circuit.

Figure 9:
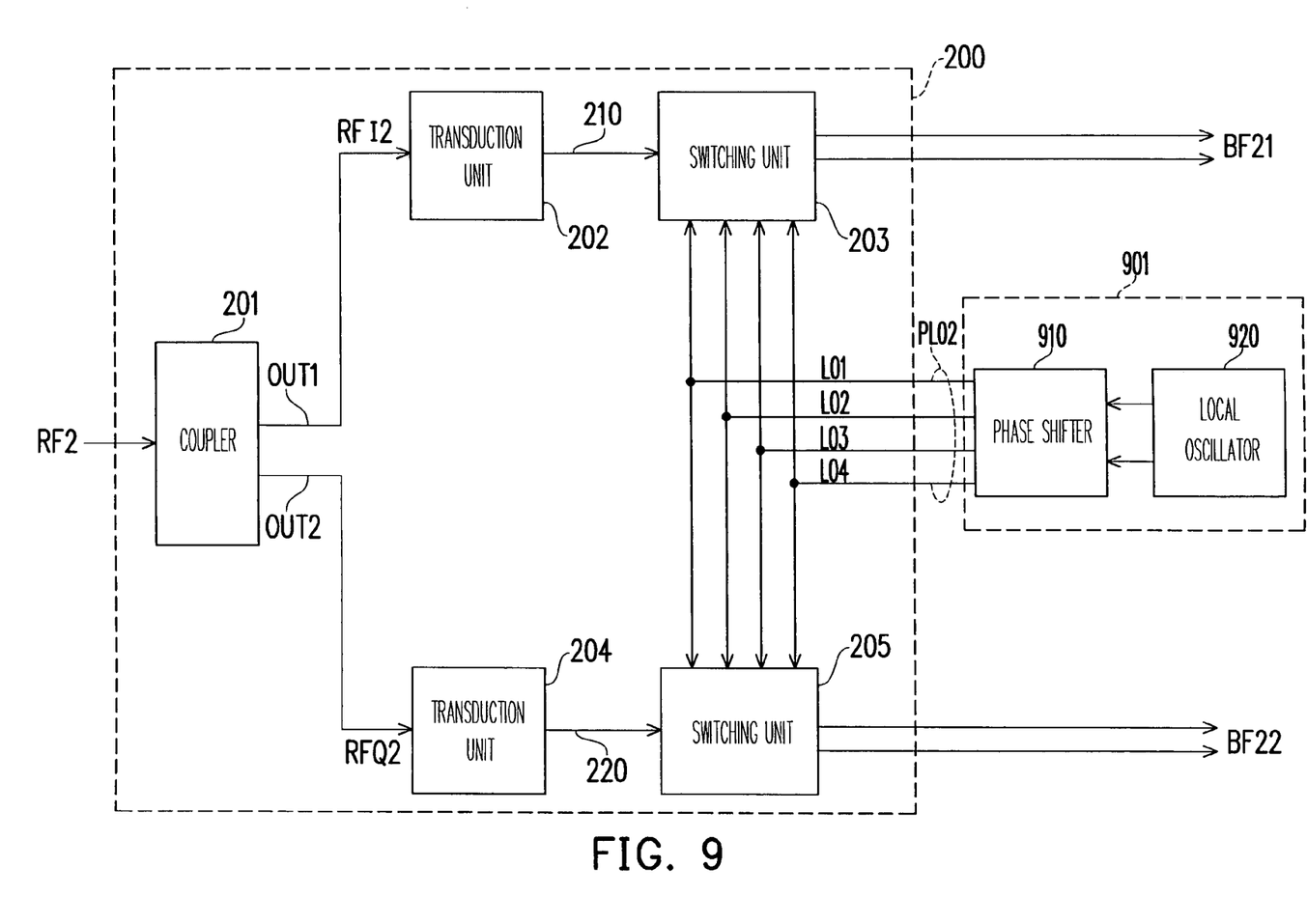
FIG. 9 is a structure diagram of a down converter according to the embodiment of the present invention.

FIG. 9 is a structure diagram of a down converter according to the embodiment of the present invention. The down converter in FIG. 9 includes a signal generator circuit 901 and a frequency-converting circuit 200. The frequency-converting circuit 200 includes a coupler 201, two transduction units 202 and 204 and two switching units 203 and 205. The frequency-converting circuit 200 is coupled with the signal generator circuit 901, which is used for providing the frequency-converting circuit 200 with a poly-phase LO signal PLO2 (including four LO signals LO1~LO4). The coupler 201 in the frequency-converting circuit 200 converts an RF signal RF2 into two quadrature RF signals RFI2 and RFQ2. The transduction unit 202 coupled with the coupler 201 amplifies the RF signals RFI2, while the switching unit 203 performs switching operations on the output signal of the transduction unit 202 according to the poly-phase LO signal PLO2 and produces a first baseband signal BF21. The transduction unit 204 coupled with the coupler 201 amplifies the RF signals RFQ2, while the switching unit 205 performs switching operations on the output signal of the transduction unit 204 according to the poly-phase LO signal PLO2 and produces a second baseband signal BF22.

The above-described signal generator circuit 901 includes an LO 920 and a phase shifter 910. The phase shifter 910 is coupled with the LO 920, while LO 920 is used for producing an LO signal, so that the phase shifter 910 is able to convert the received LO signal into multiple LO signals with different phase displacements for outputting as a poly-phase LO signal. The working principle, the circuit structure and the relevant circuit behavior of the frequency-converting circuit 200 herein are depicted in the embodiments as shown in FIGS. 2~8; thus, the details are omitted to describe for simplicity.

In summary, the present invention adopts a transformer-coupling approach, makes the transduction units run in single input port mode, enables the two switching units to receive the same poly-phase LO signal and to perform frequency-mixing operations on the output signals generated by the transduction units and produces two quadrature baseband signals. In this way, in comparison with the conventional architecture, not only the coupler in single input port mode of the present invention has a less power consumption, but also the down converter employs the frequency-converting circuit of the present invention gets the upper hand of reduced circuit complexity and chip area.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A frequency-converting circuit, used for converting an radio frequency (RF) signal into a first baseband signal according to a poly-phase local oscillating (LO) signal; the frequency-converting circuit comprising:
   a coupler for receiving and splitting the RF signal and delivering a first RF signal via a first output terminal thereof, wherein the coupler further delivers a second RF signal via a second output terminal, the second RF signal and the first RF signal are quadrature to each other, and the coupler comprises:
   a first transformer having a primary winding and a secondary winding, wherein the first end of the primary winding is for receiving the RF signal, the second end of the primary winding is for producing the first RF signal and the first end of the secondary winding is for producing the second RF signal;
   a second capacitor, connected in series between the second end of the primary winding of the first transformer and the ground;
   a third capacitor, connected in series between the second end of the primary winding of the first transformer and the first end of the secondary winding of the first transformer;
   a third resistor, connected in series between the second end of the secondary winding of the first transformer and the ground;
   a fourth capacitor, connected in series between the second end of the secondary winding of the first transformer and the ground;
   a fifth capacitor, connected in series between the first end of the primary winding of the first transformer and the ground;
   a sixth capacitor, connected in series between the first end of the primary winding of the first transformer and the second end of the secondary winding of the first transformer, and
   a seventh capacitor, connected in series between the first end of the secondary winding of the first transformer and the ground;
   a first transduction unit, electrically connected to the first output terminal and used for amplifying the first RF signal; and
   a first switching unit, electrically connected to the first transduction unit and used for performing switching operations on the output signal of the first transduction unit according to the poly-phase LO signal and producing the first baseband signal.

2. The frequency-converting circuit as recited in claim 1, wherein the first transduction unit comprises:
   a second transformer having a primary winding and a secondary winding, wherein the first end of the primary winding is for receiving the first RF signal, the second end of the primary winding is grounded, the middle tapped end of the secondary winding is grounded, and the first end and the second end of the secondary winding are electrically connected to the first switching unit; and
   a first capacitor, wherein the first terminal thereof is coupled with the first end of the primary winding of the second transformer, while the second terminal thereof is coupled with the second end of the primary winding of the second transformer.

3. The frequency-converting circuit as recited in claim 2, wherein the poly-phase LO signal comprises a first LO signal, a second LO signal, a third LO signal and a fourth LO signal; the first switching unit comprises:
   a first resistor, wherein the first end thereof is coupled with an operation voltage;
   a second resistor, wherein the first end thereof is coupled with the operation voltage;
   a first N-type transistor, wherein the drain thereof is coupled with the second end of the first resistor, the source thereof is coupled with the first end of the secondary winding of the second transformer, and the gate thereof is used for receiving the first LO signal;
   a second N-type transistor, wherein the drain thereof is coupled with the second end of the first resistor, the source thereof is coupled with the source of the first N-type transistor, and the gate thereof is used for receiving the third LO signal;
   a third N-type transistor, wherein the drain thereof is coupled with the second end of the second resistor, the source thereof is coupled with the source of the first N-type transistor, and the gate thereof is used for receiving the second LO signal;
   a fourth N-type transistor, wherein the drain thereof is coupled with the second end of the second resistor, the source thereof is coupled with the source of the first N-type transistor, and the gate thereof is used for receiving the fourth LO signal;
   a fifth N-type transistor, wherein the drain thereof is coupled with the second end of the first resistor, the source thereof is coupled with the second end of the secondary winding of the second transformer, and the gate thereof is used for receiving the fourth LO signal;
   a sixth N-type transistor, wherein the drain thereof is coupled with the second end of the first resistor, the source thereof is coupled with the source of the fifth N-type transistor, and the gate thereof is used for receiving the second LO signal;
   a seventh N-type transistor, wherein the drain thereof is coupled with the second end of the second resistor, the source thereof is coupled with the source of the fifth N-type transistor, and the gate thereof is used for receiving the first LO signal; and
   an eighth N-type transistor, wherein the drain thereof is coupled with the second end of the second resistor, the source thereof is coupled with the source of the fifth N-type transistor, and the gate thereof is used for receiving the third LO signal;
   wherein the signal at the second end of the first resistor and the signal at the second end of the second resistor are the first baseband signal.

4. The frequency-converting circuit as recited in claim 3, wherein all the frequencies of the four LO signals, from the first LO signal to the fourth LO signal, are 0.5 times of the frequency of the RF signal; the phase displacement of the i-th is 90° smaller than the phase displacement of the (i+1)-th, where i is a positive integer larger than zero and 1<i<3.

5. The frequency-converting circuit as recited in claim 1, wherein the frequency-converting circuit further comprises:
   a second transduction unit, electrically connected to the second output terminal of the coupler and used for amplifying the second RF signal; and
   a second switching unit, electrically connected to the second transduction unit and used for performing switching operations on the output signal of the second transduction unit according to the poly-phase LO signal and producing the second baseband signal, wherein the second baseband signal and the first baseband signal are quadrature to each other.

6. The frequency-converting circuit as recited in claim 5, wherein the second transduction unit comprises:
- a third transformer having a primary winding and a secondary winding, wherein the first end of the primary winding is for receiving the second RF signal, the second end of the primary winding is grounded, the middle tapped end of the secondary winding is grounded, and the first end and the second end of the secondary winding are electrically connected to the second switching unit, and
- an eighth capacitor, wherein the first terminal thereof is coupled with the first end of the primary winding of the third transformer, while the second terminal thereof is coupled with the second end of the primary winding of the third transformer.

7. The frequency-converting circuit as recited in claim 6, wherein the poly-phase LO signal comprises a first LO signal, a second LO signal, a third LO signal and a fourth LO signal, and the second switching unit comprises:
- a fourth resistor, wherein the first end thereof is coupled with an operation voltage;
- a fifth resistor, wherein the first end thereof is coupled with the operation voltage;
- a ninth N-type transistor, wherein the drain thereof is coupled with the second end of the fourth resistor, the source thereof is coupled with the second end of the secondary winding of the third transformer, and the gate thereof is used for receiving the first LO signal;
- a tenth N-type transistor, wherein the drain thereof is coupled with the second end of the fourth resistor, the source thereof is coupled with the source of the ninth N-type transistor, and the gate thereof is used for receiving the third LO signal;
- an eleventh N-type transistor, wherein the drain thereof is coupled with the second end of the fifth resistor, the source thereof is coupled with the source of the ninth N-type transistor, and the gate thereof is used for receiving the second LO signal;
- a twelfth N-type transistor, wherein the drain thereof is coupled with the second end of the fifth resistor, the source thereof is coupled with the source of the ninth N-type transistor, and the gate thereof is used for receiving the fourth LO signal;
- a thirteenth N-type transistor, wherein the drain thereof is coupled with the second end of the fourth resistor, the source thereof is coupled with the first end of the secondary winding of the third transformer, and the gate thereof is used for receiving the fourth LO signal;
- a fourteenth N-type transistor, wherein the drain thereof is coupled with the second end of the fourth resistor, the source thereof is coupled with the source of the thirteenth N-type transistor, and the gate thereof is used for receiving the second LO signal;
- a fifteenth N-type transistor, wherein the drain thereof is coupled with the second end of the fifth resistor, the source thereof is coupled with the source of the thirteenth N-type transistor, and the gate thereof is used for receiving the first LO signal; and
- a sixteenth N-type transistor, wherein the drain thereof is coupled with the second end of the fifth resistor, the source thereof is coupled with the source of the thirteenth N-type transistor, and the gate thereof is used for receiving the third LO signal;
- wherein the signal at the second end of the fourth resistor and the signal at the second end of the fifth resistor are the second baseband signal.

8. The frequency-converting circuit as recited in claim 7, wherein all the frequencies of the four LO signals, from the first LO signal to the fourth LO signal, are 0.5 times of the frequency of the RF signal; the phase displacement of the i-th is 90° smaller than the phase displacement of the (i1)-th, where i is a positive integer larger than zero and 1<i <3.

9. A down converter, used for converting an radio frequency (RF) signal into a first baseband signal, the down converter comprising:
- a signal generator circuit for providing a poly-phase local oscillating (LO) signal; and
- a frequency-converting circuit, coupled with the signal generator circuit, comprising:
  - a coupler for receiving and splitting the RF signal and delivering a first RF signal via a first output terminal thereof, wherein the coupler further delivers a second RF signal via a second output terminal, the second RF signal and the first RF signal are quadrature to each other, and the coupler comprises:
    - a first transformer having a primary winding and a secondary winding. wherein the first end of the primary winding is for receiving the RF signal, the second end of the primary winding is for producing the first RF signal and the first end of the secondary winding is for producing the second RF signal;
    - a second capacitor, connected in series between the second end of the primary winding of the first transformer and the ground;
    - a third capacitor, connected in series between the second end of the primary winding of the second transformer and the first end of the secondary winding of the first transformer;
    - a third resistor, connected in series between the second end of the secondary winding of the first transformer and the ground;
    - a fourth capacitor, connected in series between the second end of the secondary winding of the first transformer and the ground;
    - a fifth capacitor, connected in series between the first end of the primary winding of the first transformer and the ground;
    - a sixth capacitor, connected in series between the first end of the primary winding of the first transformer and the second end of the secondary winding of the first transformer; and
    - a seventh capacitor. connected in series between the first end of the secondary winding of the first transformer and the ground;
  - a first transduction unit, electrically connected to the first output terminal and used for amplifying the first RF signal; and
  - a first switching unit, electrically connected to the first transduction unit and used for performing switching operations on the output signal of the first transduction unit according to the poly-phase LO signal and producing the first baseband signal.

10. The down converter as recited in claim 9, wherein the signal generator circuit comprises:
- a Local oscillator (LO) for producing a local oscillating signal (LO signal); and
- a phase shifter, coupled with the LO and used for converting the LO signal into a plurality of LO signals with different phase displacements, so as to output the LO signals as the poly-phase LO signal.

11. The down converter as recited in claim 9, wherein the first transduction unit comprises:
- a second transformer having a primary winding and a secondary winding, wherein the first end of the primary winding is for receiving the first RF signal, the second end of the primary winding is grounded, the middle tapped end of the secondary winding is grounded, and the first end and the second end of the secondary winding are electrically connected to the first switching unit; and
- a first capacitor, wherein the first terminal thereof is coupled with the first end of the primary winding of the second transformer, while the second terminal thereof is coupled with the second end of the primary winding of the second transformer.

12. The down converter as recited in claim 11, wherein the poly-phase LO signal comprises a first LO signal, a second LO signal, a third LO signal and a fourth LO signal; the first switching unit comprises:
- a first resistor, wherein the first end thereof is coupled with an operation voltage;
- a second resistor, wherein the first end thereof is coupled with the operation voltage;
- a first N-type transistor, wherein the drain thereof is coupled with the second end of the first resistor, the source thereof is coupled with the first end of the secondary winding of the second transformer, and the gate thereof is used for receiving the first LO signal;
- a second N-type transistor, wherein the drain thereof is coupled with the second end of the first resistor, the source thereof is coupled with the source of the first N-type transistor, and the gate thereof is used for receiving the third LO signal;
- a third N-type transistor, wherein the drain thereof is coupled with the second end of the second resistor, the source thereof is coupled with the source of the first N-type transistor, and the gate thereof is used for receiving the second LO signal;
- a fourth N-type transistor, wherein the drain thereof is coupled with the second end of the second resistor, the source thereof is coupled with the source of the first N-type transistor, and the gate thereof is used for receiving the fourth LO signal;
- a fifth N-type transistor, wherein the drain thereof is coupled with the second end of the first resistor, the source thereof is coupled with the second end of the secondary winding of the second transformer, and the gate thereof is used for receiving the fourth LO signal;
- a sixth N-type transistor, wherein the drain thereof is coupled with the second end of the first resistor, the source thereof is coupled with the source of the fifth N-type transistor, and the gate thereof is used for receiving the second LO signal;
- a seventh N-type transistor, wherein the drain thereof is coupled with the second end of the second resistor, the source thereof is coupled with the source of the fifth N-type transistor, and the gate thereof is used for receiving the first LO signal; and
- an eighth N-type transistor, wherein the drain thereof is coupled with the second end of the second resistor, the source thereof is coupled with the source of the fifth N-type transistor, and the gate thereof is used for receiving the third LO signal;
- wherein the signal at the second end of the first resistor and the signal at the second end of the second resistor are the first baseband signal.

13. The down converter as recited in claim 12, wherein all the frequencies of the four LO signals, from the first LO signal to the fourth LO signal, are 0.5 times of the frequency of the RF signal; the phase displacement of the i-th is 90° smaller than the phase displacement of the (i+1)-th, where i is a positive integer larger than zero and $1 < i < 3$.

14. The down converter as recited in claim 9, wherein the coupler further delivers a second RF signal via a second output terminal, the second RF signal and the first RF signal are quadrature to each other, and the frequency-converting circuit farther comprises:
- a second transduction unit, electrically connected to the second output terminal of the coupler and used for amplifying the second RF signal; and
- a second switching unit, electrically connected to the second transduction unit and used for performing switching operations on the output signal of the second transduction unit according to the poly-phase LO signal and producing the second baseband signal, wherein the second baseband signal and the first baseband signal are quadrature to each other.

15. The down converter as recited in claim 14, wherein the second transduction unit comprises:
- a third transformer having a primary winding and a secondary winding, wherein the first end of the primary winding is for receiving the second RF signal, the second end of the primary winding is grounded, the middle tapped end of the secondary winding is grounded, and the first end and the second end of the secondary winding are electrically connected to the second switching unit; and
- an eighth capacitor, wherein the first terminal thereof is coupled with the first end of the primary winding of the third transformer, while the second terminal thereof is coupled with the second end of the primary winding of the third transformer.

16. The down converter as recited in claim 15, wherein the poly-phase LO signal comprises a first LO signal, a second LO signal, a third LO signal and a fourth LO signal, and the second switching unit comprises:
- a fourth resistor, wherein the first end thereof is coupled with an operation voltage;
- a fifth resistor, wherein the first end thereof is coupled with the operation voltage;
- a ninth N-type transistor, wherein the drain thereof is coupled with the second end of the fourth resistor, the source thereof is coupled with the second end of the secondary winding of the third transformer, and the gate thereof is used for receiving the first LO signal;
- a tenth N-type transistor, wherein the drain thereof is coupled with the second end of the fourth resistor, the source thereof is coupled with the source of the ninth N-type transistor, and the gate thereof is used for receiving the third LO signal;
- an eleventh N-type transistor, wherein the drain thereof is coupled with the second end of the fifth resistor, the source thereof is coupled with the source of the ninth N-type transistor, and the gate thereof is used for receiving the second LO signal;
- a twelfth N-type transistor, wherein the drain thereof is coupled with the second end of the fifth resistor, the source thereof is coupled with the source of the ninth N-type transistor, and the gate thereof is used for receiving the fourth LO signal;
- a thirteenth N-type transistor, wherein the drain thereof is coupled with the second end of the fourth resistor, the source thereof is coupled with the first end of the secondary winding of the third transformer, and the gate thereof is used for receiving the fourth LO signal;

a fourteenth N-type transistor, wherein the drain thereof is coupled with the second end of the fourth resistor, the source thereof is coupled with the source of the thirteenth N-type transistor, and the gate thereof is used for receiving the second LO signal;

a fifteenth N-type transistor, wherein the drain thereof is coupled with the second end of the fifth resistor, the source thereof is coupled with the source of the thirteenth N-type transistor, and the gate thereof is used for receiving the first LO signal; and a sixteenth N-type transistor, wherein the drain thereof is coupled with the second end of the fifth resistor, the source thereof is coupled with the source of the thirteenth N-type transistor, and the gate thereof is used for receiving the third LO signal;

wherein the signal at the second end of the fourth resistor and the signal at the second end of the fifth resistor are the second baseband signal.

17. The down converter as recited in claim 16, wherein all the frequencies of the four LO signals, from the first LO signal to the fourth LO signal, are 0.5 times of the frequency of the RF signal; the phase displacement of the i-th is 90° smaller than the phase displacement of the (i+1)-th, where i is a positive integer larger than zero and 1<i<3.

* * * * *